United States Patent [19]
Han et al.

[11] Patent Number: 5,725,973
[45] Date of Patent: Mar. 10, 1998

[54] PHOTO MASK AND METHOD FOR MANUFACTURING SAME

[75] Inventors: Woo-sung Han, Kyungki-do; Chang-jin Sohn, Seoul, both of Rep. of Korea

[73] Assignee: Samsung Electronic Co., Ltd., Suwon, Rep. of Korea

[21] Appl. No.: 632,834

[22] Filed: Apr. 16, 1996

Related U.S. Application Data

[63] Continuation of Ser. No. 370,390, Jan. 10, 1995, abandoned.

[30] Foreign Application Priority Data

Feb. 7, 1994 [KR] Rep. of Korea ............. 94-2310

[51] Int. Cl.$^6$ ..................................... G03F 9/00
[52] U.S. Cl. ................................ 430/5; 430/322
[58] Field of Search ................ 430/5, 311, 312, 430/322, 313

[56] References Cited

U.S. PATENT DOCUMENTS

| | | | |
|---|---|---|---|
| 4,902,899 | 2/1990 | Lin et al. | 430/5 |
| 5,208,124 | 5/1993 | Sporon-Fielder et al. | 430/5 |

*Primary Examiner*—S. Rosasco
*Attorney, Agent, or Firm*—Allen LeRoy Limberg

[57] ABSTRACT

A photo mask and method for manufacturing the same increase the capacitance of a capacitor by improving the proximity effect of a mask pattern. The photo mask includes a transparent substrate, an opaque mask pattern for defining an optical transmission area on the substrate, and an optical transmittance control film pattern for suppressing proximity effect in the optical transmission area. The proximity effect is suppressed by forming an optical transmittance control film pattern in the transmission area between the individual portions of the opaque mask pattern, so that the mask pattern shape can be exactly transferred onto a substrate.

19 Claims, 16 Drawing Sheets

PHOTO MASK AND METHOD FOR MANUFACTURING SAME

This application is a continuation of application Ser. No. 08/370,390 filed Jan. 10, 1995, which application is now abandoned.

BACKGROUND OF THE INVENTION

The present invention relates to a semiconductor photolithography technique, and more particularly, to a photo mask and method for manufacturing same which can increase the capacitance of a capacitor in a semiconductor memory device by improving a proximity effect of the mask pattern.

Generally, the unit cell of a semiconductor memory device can be divided into a transistor portion and a capacitor portion. In current semiconductors, the transistor uses a MOS structure and the capacitor uses a stack structure where several material layers are sequentially formed. Especially, for a semiconductor memory device having a high density, a unit cell having one transistor is typically used.

FIG. 1 illustrates an exemplary unit cell in a semiconductor memory device having one transistor. Referring to FIG. 1, a capacitor C is connected across the gate and source of a MOS transistor. In a semiconductor memory device, especially DRAMs, it is highly desirable for the capacitance of capacitor C to be large, since several performance characteristics are improved by larger capacitance.

The capacitance (C) of a parallel-plate capacitor, such as that used in semiconductor memory devices, is calculated by the well-known formula $C=\epsilon(A/d)$, where $\epsilon$ denotes a dielectric constant, A denotes the surface area of a plate, and d denotes the distance (gap) between the plates. Thus, in order to increase the capacitance of the parallel-plate capacitor, a material having a larger dielectric constant is used, the distance (gap) between the plates is minimized, or the surface area of the plate is increased. However, the number of practical dielectric materials is limited and their dielectric constants are fixed. On the other hand, decreasing gap size greatly increases the chance of punch-through which degrades the operating characteristics of the device. Accordingly, research has largely concentrated on ways to increase the surface area of capacitor plates (electrodes).

A key step in the formation of semiconductor memory devices, is the transfer a pattern used to form a source, drain, and capacitor of a semiconductor memory device on a semiconductor substrate. Use of a photolithography technique using a photo mask is indispensable in accomplishing this step during overall semiconductor manufacturing processes.

Generally, the photolithography technique can be divided into two processes. The first process is forming a photoresist pattern on a layer using a photo mask. The second process is etching an under-layer (formed under the photoresist pattern) using the photoresist pattern as a mask and then removing the photoresist pattern. Here, the first process will be explained in more detail with reference to FIG. 2A and FIG. 2B.

FIG. 2A is a plan view of a photo mask for transferring a pattern to form a capacitor on a semiconductor substrate. Referring to FIG. 2A, a rectangular opaque mask pattern 1 is regularly formed, reference numeral 2 denotes a space existing between the edges of opaque mask pattern 1 at the intersections of the pattern margins. In a conventional semiconductor device, the process of transferring a photo mask having the opaque mask pattern 1 onto a semiconductor substrate is used.

FIG. 2B is a plan view of a photoresist pattern 3 when an opaque mask pattern is transferred onto a semiconductor substrate using the photo mask shown in FIG. 2A. Referring to FIG. 2B, when opaque mask pattern 1 is transferred onto a semiconductor substrate using the photo mask shown in FIG. 2A, a proximity effect takes place between the edge portions of opaque mask pattern 1. The proximity effect is due to a diffraction of incident light rays (e.g., ultraviolet light) on the photomask. When the ultraviolet light rays pass between portions of the opaque mask patterns 1, the shape of photoresist pattern 3 is undesirably rounded by diffraction of the light rays. Also, the spacing (reference numeral 4) between edges of the photoresist patterns increases as a result of the proximity effect. The proximity effect is particularly pronounced when photoresist pattern 3 is applied as an etching mask, that is when the pattern is used to form a capacitor on a semiconductor substrate. In this circumstance, the etched shape of the layer is also rounded. As a result, an area, i.e., capacitor area ("A" of above formula), is reduced. This reduction necessarily decreases cell capacitance of a semiconductor memory device.

In order to explain the proximity effect in more detail, the results of a SOLID (Simulation of Optical Lithography In Three Dimensions) simulator are shown in FIG. 4 and FIG. 5, wherein an exposing and developing process simulation based on a conventional photo mask shown in FIG. 3 is performed. The simulation is performed using a deep ultraviolet (DUV) stepper at a wavelength ($\lambda$) of 0.248 μm and a numerical aperture (NA) of 0.45.

FIG. 3 is a layout view of a conventional photo mask. Here, a rectangular opaque mask pattern 7 for selectively blocking light is formed on a substrate, and the area where opaque mask pattern 7 does not block the light is an optical transmission area. The dimensions of rectangular opaque mask pattern 7 are as follows. Width 31 and length 33 of each portion of rectangular opaque mask pattern 7 are 0.42 μm and 1.18 μm, respectively. X-axis Spacing 32 and y-axis spacing 34 between the opaque mask patterns are 0.28 μm and 0.22 μm, respectively.

FIG. 4 is an aerial image created by a simulation in which a pattern is transferred onto a substrate using the photo mask of FIG. 3. Referring to FIG. 4, the contour lines around the point of reference character 5a are much denser than in other areas. These densely formed contour lines correspond to an optical transmission area between the edges of opaque mask pattern 7 in FIG. 3. Especially, in the optical transmission area between opaque mask patterns 7, light is gathered when the mask pattern is transferred, to thereby exhibit the maximum degree of proximity effect.

FIG. 5 is a graph representing the simulated light intensity along line a—a' of FIG. 4. Here, we note that the light intensity along line a—a' is not uniform. As a result of the proximity effect, light intensity is high at the portions indicated by reference numeral 5 which corresponds to reference numeral 5a of FIG. 4.

As a result, when a conventional mask, as shown in FIG. 2, is used in a photolithography process, a rounded photoresist pattern is formed on the semiconductor substrate by a proximity effect. Therefore, when a layer forming a cell capacitor is etched using this rounded pattern, capacitor unit area is reduced which decreases the cell capacitance of the semiconductor memory device.

An approach taken in the prior art for solving problems of proximity effects in projection lithography concerns changing the size of the opaque pattern features depending on their proximity to other opaque pattern features. This approach is described in U.S. Pat. No. 5,208,124 issued May 4, 1993, to Sporon-Fiedler et alii and entitled *Method of Making a Mask for Proximity Effect Correction in Projection Lithography*. This method, while applicable to continuous edges, is not easily employed to prevent corner rounding. Preserving the original shapes of the opaque pattern features and just changing their size does not prevent corner rounding, which comes about because of light reaching the photoresistive material from two orthogonal directions. When making the original artwork from which the photomasks for photolithography are subsequently made, small protrusions from the corners of opaque mask features can be created in an attempt to prevent light reaching the photoresistive material from two orthogonal directions to cause corner rounding. Creating such small protrusions undesirably involves plotting procedures that are not straight-line in nature, or that involve many very-short-segment straight lines for approximating curved lines, which increases the costs of the original artwork. Also, small protrusions are not resolved well when light is projected past them. Light still creeps under both the edges of the opaque pattern that join to make the corner, and corner rounding tends to occur after etching the photoresistive material anyway. The approach is particularly unworkable when opaque mask features are reduced in size to take full advantage of high-resolution photolithographic processes. An approach that allows the original shapes of the opaque pattern features to be preserved is clearly preferable.

Another approach taken in the the prior art for solving problems of proximity effects in projection lithography concerns the introduction of compensating diffraction effects by introducing 180° phase plates at the rims of alternate opaque photomask features and at the rims of alternate opaque photomask features introducing 360° phase plates or, alternatively, avoiding the use of phase plates at these rims and introducing 180° phase plates in the openings through the opaque photomask by etching into the transparent substrate. These approaches are disclosed in U.S. Pat. No. 5,302,477 issued Apr. 12, 1994, to Dao et alii and entitled *Inverted Phase-shifted Reticle*.

The Dao et alii technique also introduces undesirable complexity and extra expense into the making of the photomasks for photolithography from the original artwork. Numerous additional photolithography steps that have to be carefully controlled are involved with etching phase plates into the glass or quartz transparent substrate for the opaque photomask. Etching of glass or quartz substrate is relatively difficult compared to the etching of metal or photoresist films. Furthermore, the surface of a glass or quartz substrate that has been etched is no longer smooth, so there is undesirable scattering of light. Where 180° and 360° phase plates are etched in photoresist, the step etches have to be carefully controlled; even so, accurate phase plates are difficult to obtain in practice. Furthermore, the phase-plate features have to have smaller pattern sizes than the transparent regions between opaque mask features. This becomes an impossibility in high-resolution photolithographic processes, as opaque mask features and the transparent regions between the opaque mask features are reduced in size, close to optical resolution limits.

The inventors had the insight that corner rounding can be reduced, even though phase-cancellation procedures are not relied upon to keep light from reaching the photoresistive material from two orthogonal directions, if the light falling onto the photoresistive material from each direction is reduced in intensity—e.g., halved from each direction—so exposure of the photoresistive material along the portions of the edges of opaque features near their corners is not increased appreciably over the exposure along the portions of the edges remote from their corners.

A method to reduce the intensity of light reaching a surface that is known in a general way is an optical transmittance control film. One well-known way to make an optical transmittance control film is to make an "optically thin" film of a material that is opaque in thicker films or in solids, most metals being examples of such material. Reflection is the primary mechaism for reducing optical transmittance in such films. Another well-known way to make an optical transmittance control film is to make it of a semi-transparent material that is sufficiently thick to block a portion of the light, many common dielectrics being examples of such material. Internal absorbtion is the primary mechaism for reducing optical transmittance in such films. Layered structures alternating metal and dielectric films are commonly used for controlling optical transmittance in the camera arts. The optical transmittance of an optical transmittance control film of a paticular material can be adjusted by controlling its thickness.

The inventors perceived that an optical transmittance control film, patterned so as to be selectively present in areas of the photomask where corners between the edges of opaque features occur, would reduce the light falling onto the photoresistive material from each direction, to substantially reduce the tendency towards corner rounding. Furthermore, the tendency for projections from the corners of opaque mask features not to be resolved, which was a problem in prior-art procedures described by Sporon-Fiedler et alii, is advantageous when positioning a small-area optical transmittance control film over the corner of an opaque mask feature. Desirably, the small-area optical transmittance control film is not resolved on the photoresistive material, since light creeps under the edges of the small-area optical transmittance control film that do not overlap any opaque mask feature. Even where the corners of opaque mask features closely adjoin and are each overlapped by the same small-area optical transmittance control film positioned over them, light creeping under the edges of the small-area optical transmittance control film from more than one direction maintains definition of the adjoining corners on the photoresistive material. The small areas of optical transmittance control film can be defined by plotting procedures that are straight-line in nature when making the original artwork from which the photomasks for photolithography are subsequently made, which reduces the effort and cost of developing the original artwork. The etching of optical transmittance control films can be carried out rapidly and with relatively little need for careful control, using an etchant that does not etch the transparent substrate, so the photolithographic procedures are appreciably simpler than with the inverted phase-plate structures disclosed by Dao et alii.

SUMMARY OF THE INVENTION

It is an object of the present invention to provide a photo mask which can resist the rounding phenomenon due to a proximity effect on an exposed photoresist pattern formed on a semiconductor wafer.

It is another object of the present invention to provide a manufacturing method which is suitable for manufacturing the photo mask through simple processing.

To accomplish the above objects, there is provided a photo mask for transferring a mask pattern onto a semiconductor wafer, comprising: a transparent substrate; an opaque mask pattern formed on the substrate, for defining an optical transmission area between the edges of the opaque mask pattern, by selectively blocking light; and an optical transmittance control film pattern for suppressing a proximity effect in part of the optical transmission area.

The optical transmittance control film pattern is one selected from the group consisting of spin-on-glass (SOG), photoresist (PR), silicon oxide ($SiO_2$), aluminum (Al), silicon nitride ($Si_3N_4$), a polysilicon, titanium (Ti), titanium nitride (TiN), chromium (Cr) and tungsten (W).

Further, there is provided a photo mask for transferring a mask pattern onto a semiconductor wafer, comprising: a transparent substrate; a rectangular opaque mask pattern formed on the substrate, for defining an optical transmission area between the edges of the rectangular opaque mask pattern, by selectively blocking light; and an optical transmittance control film pattern for suppressing a proximity effect in an intersection area of the optical transmission area.

The optical transmittance control film pattern can be formed on a part of the intersection area of the optical transmission area.

Also, there is provided a photo mask for transferring a mask pattern onto a semiconductor wafer, comprising: a transparent substrate; a rectangular opaque mask pattern formed on the substrate, for defining an optical transmission area between the edges of the rectangular opaque mask pattern, by selectively blocking light; and an optical transmittance control film pattern for suppressing a proximity effect in an intersection area of the transmission area and in areas adjacent to the intersection area.

Also, there is provided a photo mask for transferring a mask pattern onto a semiconductor wafer, comprising: a transparent substrate; a rectangular opaque mask pattern formed on the substrate, for defining an optical transmission area between the edges of the rectangular opaque mask pattern, by selectively blocking light; a first optical transmittance control film pattern for suppressing a proximity effect in an intersection area of the transmission area and in areas adjacent to the intersection area, the first optical transmittance control film pattern being formed parallel to the longer side of the rectangular opaque mask pattern; and a second optical transmittance control film pattern for suppressing a proximity effect in an intersection area of the transmission area and in areas adjacent to the intersection area, the second optical transmittance control film pattern being formed perpendicular to the longer side of the rectangular opaque mask pattern.

To accomplish another object of the present invention, there is provided a method for manufacturing a photo mask, comprising the steps of: forming an opaque mask pattern for defining an optical transmission area on a substrate by selectively blocking light; forming an optical transmittance control film on the opaque mask pattern and the substrate; and forming an optical transmittance control film pattern between the edges of the opaque mask pattern by patterning the optical transmittance control film.

Further, there is provided a method for manufacturing a photo mask, comprising the steps of: forming an opaque mask pattern for defining an optical transmission area on a substrate, by selectively blocking light; forming an etch-stopping film on the opaque mask pattern and the substrate; forming an optical transmittance control film on the etch-stopping film; and forming an etch-stopping film pattern on the substrate between the edges of the opaque mask pattern and forming an optical transmittance control film pattern, by patterning the etch-stopping film and the optical transmittance control film.

The etch stopping film is one selected from the group consisting of spin-on-glass (SOG), silicon oxide ($SiO_2$), and silicon nitride ($Si_3N_4$).

In addition, the optical transmittance control film pattern is one selected from the group consisting of aluminum (Al), a polysilicon, titanium (Ti), titanium nitride (TiN), chromium (Cr) and tungsten (W).

Also, there is a method for manufacturing a photo mask, comprising the steps of: forming an opaque mask pattern for defining an optical transmission area on a substrate, by selectively blocking light; forming a photoresist film on the opaque mask pattern and the substrate; exposing the optical transmission area on the substrate by patterning the photoresist film; forming an optical transmittance control film over the entire surface of the resultant structure; and forming an optical transmittance control film pattern between the edges of the opaque mask pattern, using a lift-off process.

According to the photo mask of the present invention, since a proximity effect is suppressed by forming an optical transmittance control film pattern in an intersection area of the transmission area and in areas adjacent thereto, the shape of a mask pattern is exactly transferred onto a substrate, to thereby increase capacitor area.

BRIEF DESCRIPTION OF THE DRAWINGS

The above objects and other advantages of the present invention will become more apparent by describing in detail a preferred embodiment thereof with reference to the attached drawings in which.

Figure 6:
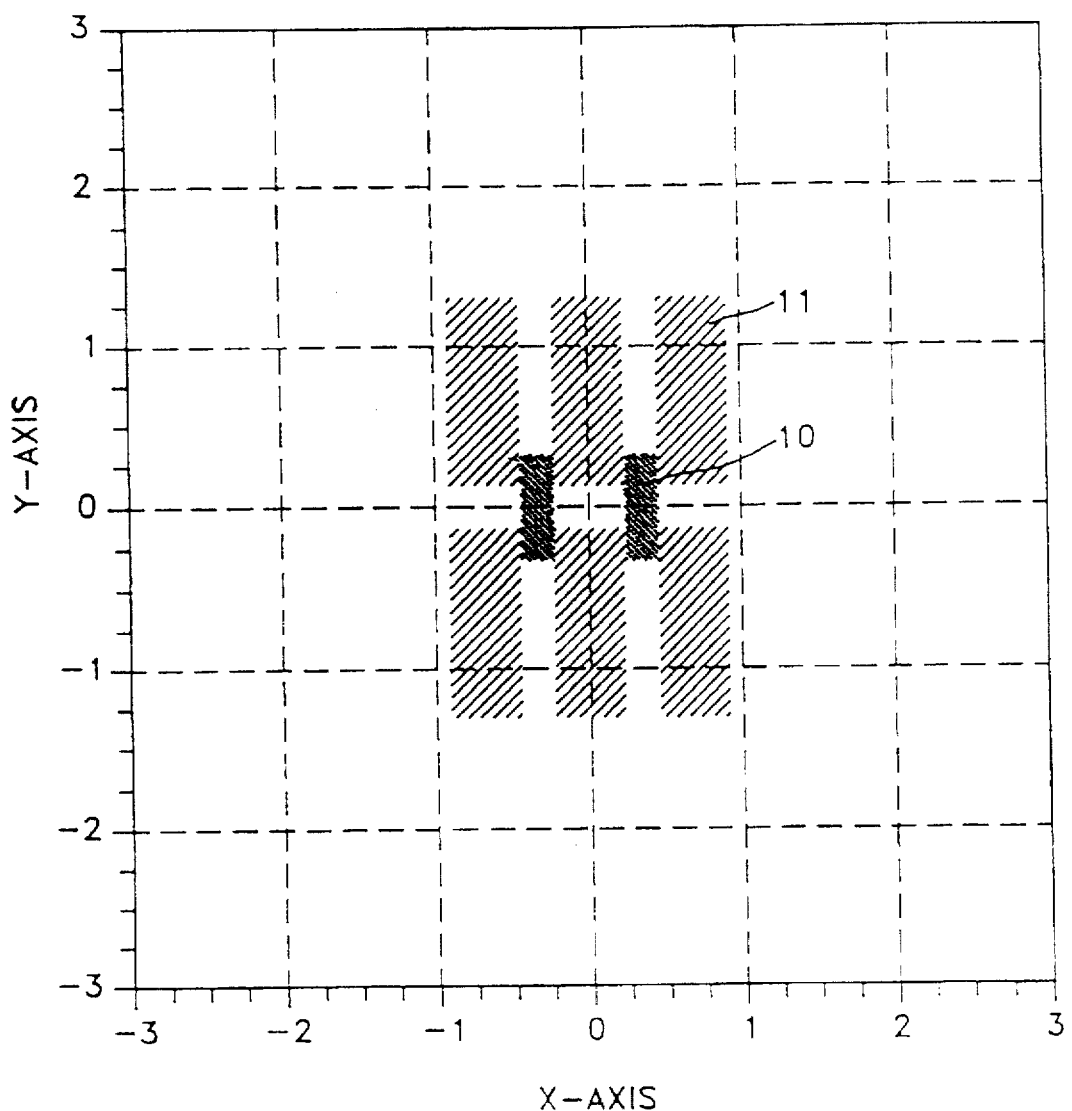
FIG. 6 is a layout view of a photo mask according to a first embodiment of the present invention.
Figure 9:
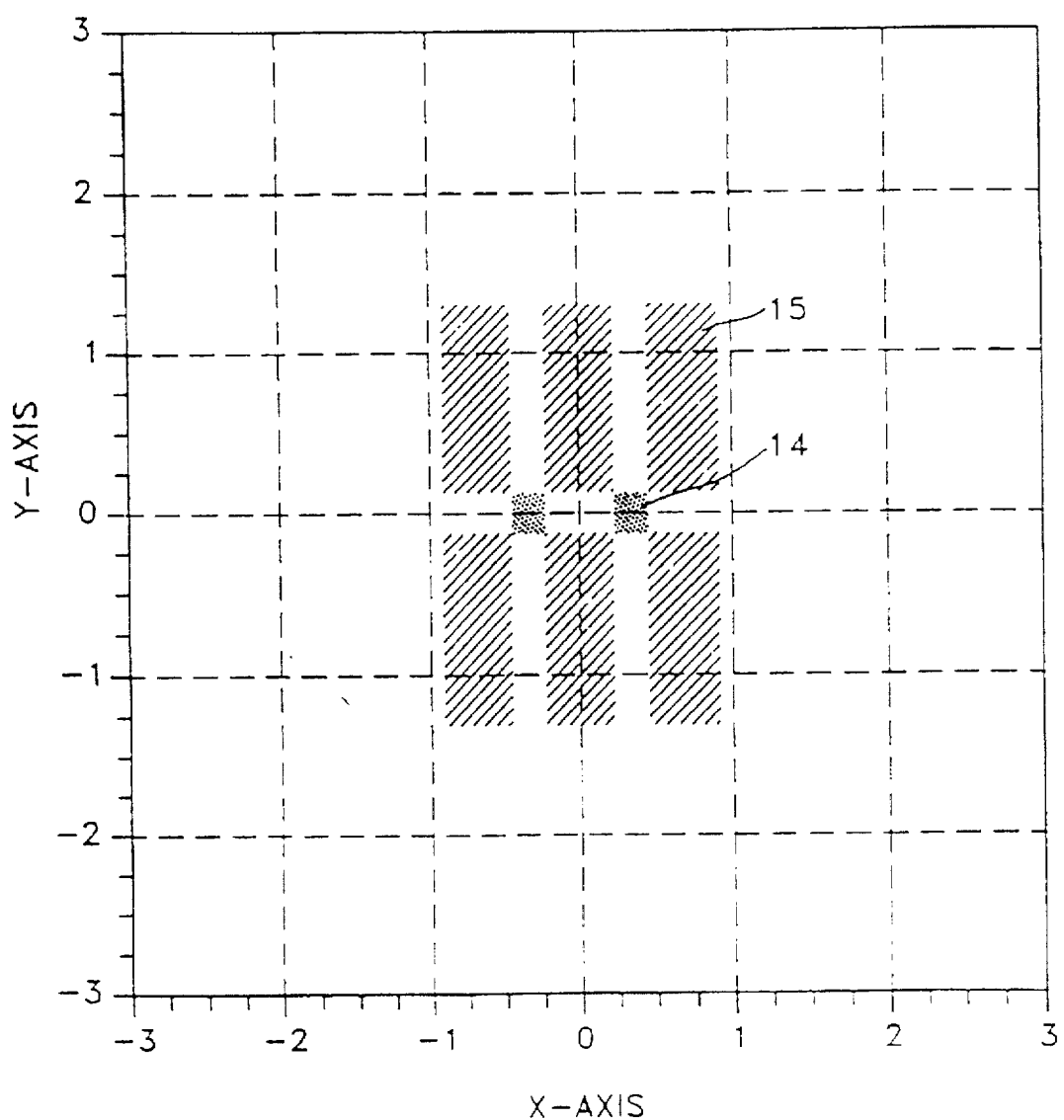
FIG. 9 is a layout view of a photo mask according to a second embodiment of the present invention.
Figure 12:
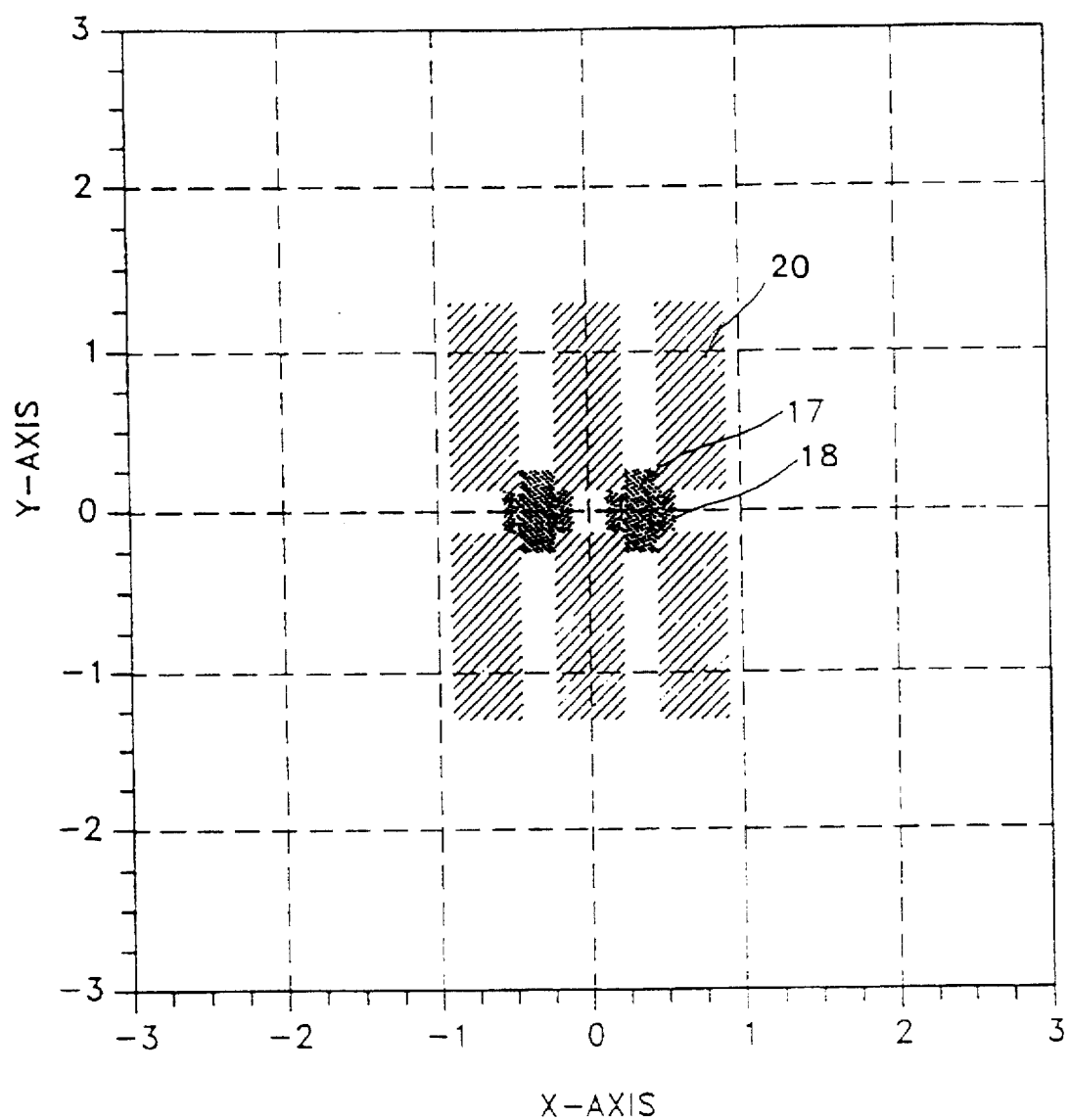
FIG. 12 is a layout view of a photo mask according to the third embodiment of the present invention.

The areas shown in single cross-hatch in FIGS. 2A, 3, 6, 9 and 12 are opaque mask features continuously filling each region of single cross-hatch; and the areas shown in double cross-hatch in FIGS. 6, 9 and 12 are films with controlled optical transmittance continuously filling each region of double cross-hatch.

DETAILED DESCRIPTION OF THE INVENTION

The present invention will be explained in more detail with reference to the attached drawings.

When an exposing and developing process is simulated using a photo mask according to the present invention, the result of a SOLID simulator is illustrated for each of the following embodiments.

Each simulation is performed using an assumed deep ultraviolet (DUV) stepper at a wavelength (λ) of 0.248 μm and a numerical aperture (NA) of 0.45. Each simulation also assumes an optical transmission rate for the optical transmittance control film of 50%.

Embodiment 1

FIG. 6 is a layout of a photo mask according to a first embodiment of the present invention. Referring to FIG. 6, a rectangular opaque mask pattern 11 defining an optical transmission area is periodically formed on a mask substrate (not shown). Also, an optical transmittance control film pattern 10 is formed in an intersection area of the optical transmission area between portions of the opaque mask pattern 11 and in the areas adjacent thereto. In more detail, the optical transmittance control film pattern 10 is formed in an intersection area defined by edges of opaque mask pattern 11. Optical transmittance control film pattern 10 is also formed in a parallel direction (Y-axis) with respect to the longer side of the rectangular opaque mask pattern. Especially, when a mask pattern is transferred onto a substrate, optical transmittance control film pattern 10 maintains a uniform light intensity, which suppress the proximity effect. The size, shape and layout of optical transmittance control film pattern 10 can be variably controlled.

In the first embodiment, the width and length of optical transmittance control film pattern 10 are 0.28 μm and 0.66 μm, respectively. The width and length of opaque mask pattern 11 are 0.42 μm and 1.18 μm, respectively. Also, the spacings between the opaque mask patterns 11 are 0.28 μm (X-axis) and 0.22 μm (y-axis), respectively.

Figure 1:
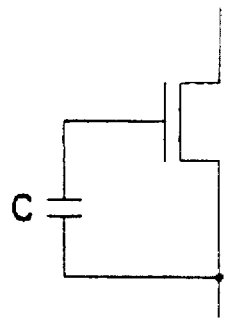
FIG. 1 is a schematic view showing an example of a unit cell having one transistor in a semiconductor memory device.
Figure 2A:
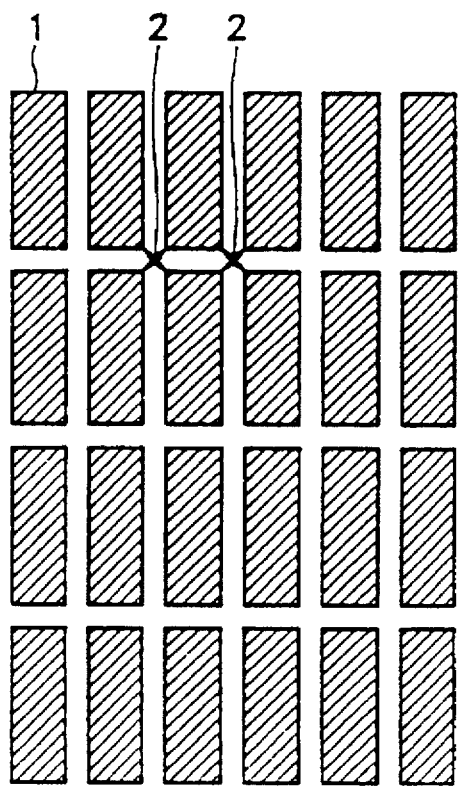
FIG. 2A is a plan view of a photo mask for transferring a pattern to form a capacitor on a semiconductor substrate.
Figure 2B:
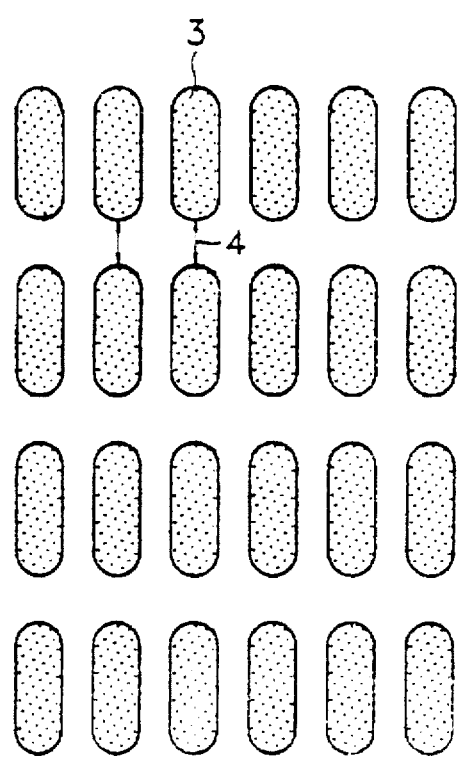
FIG. 2B is a plan view of the photoresist pattern when an opaque mask pattern is transferred onto a semiconductor substrate using the photo mask shown in FIG. 2A.
Figure 3:
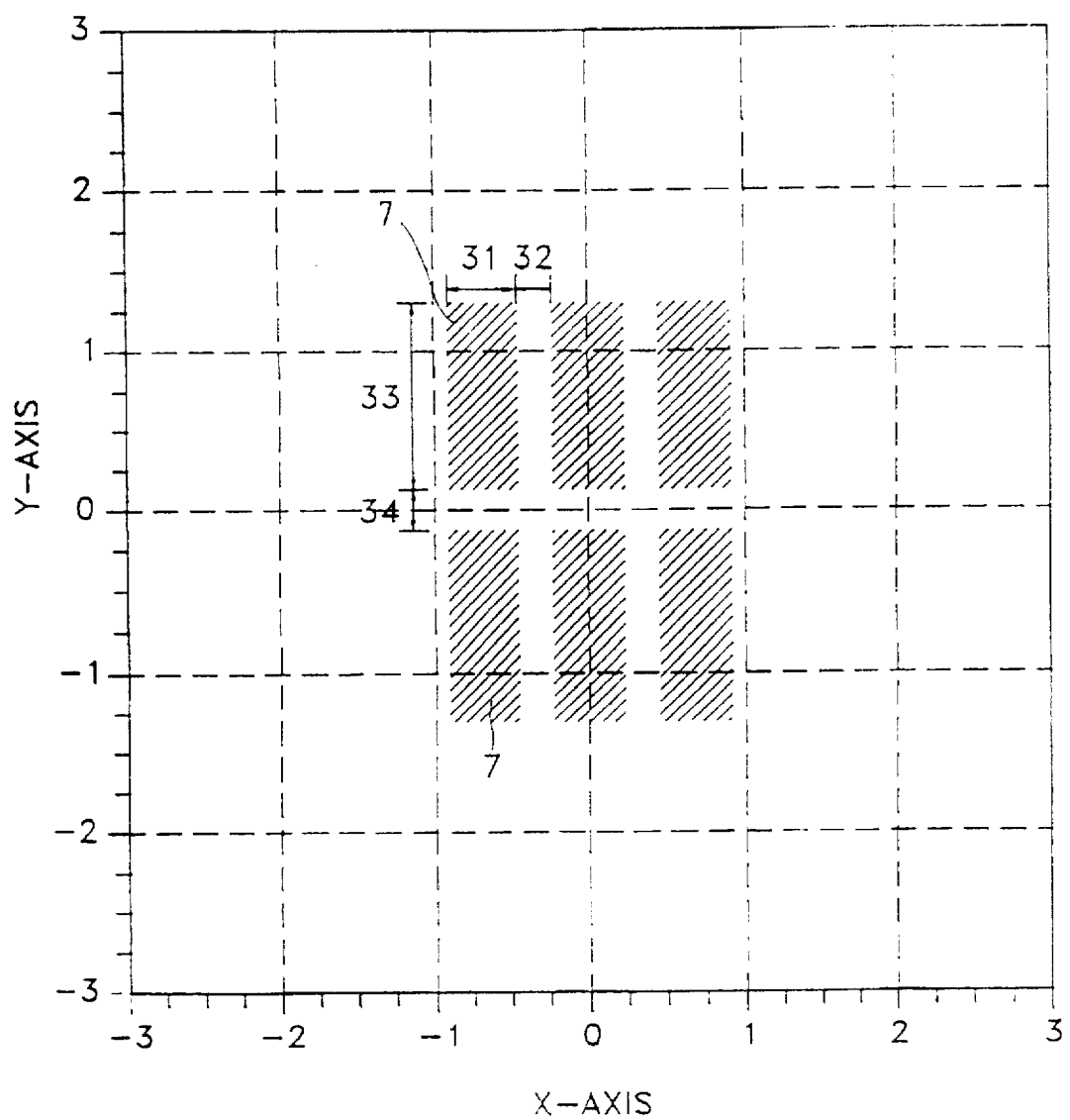
FIG. 3 is a layout view showing a conventional photo mask.
Figure 4:
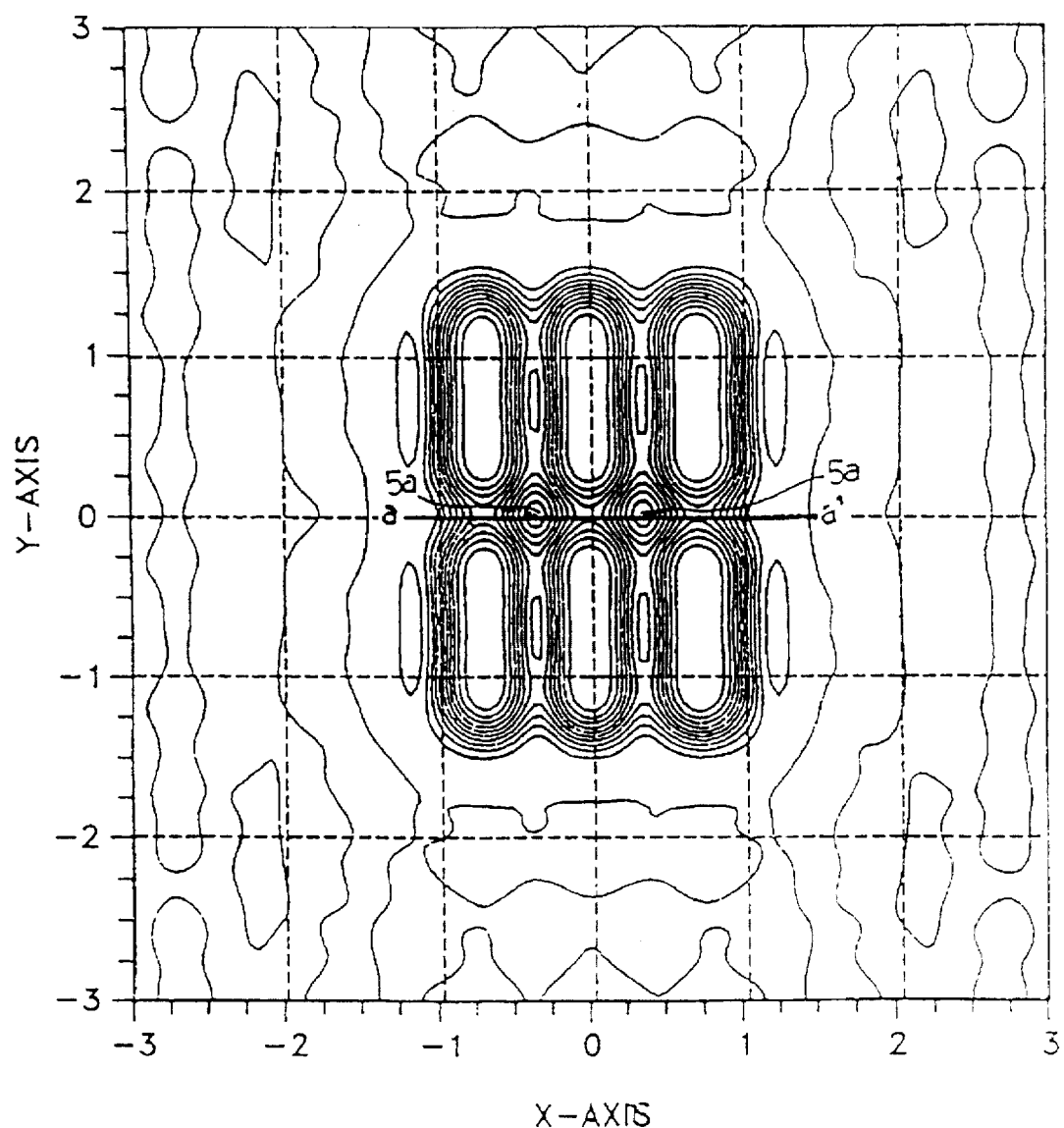
FIG. 4 is a plan view showing an aerial image created by a simulation, when a mask pattern is transferred onto a substrate using the photo mask shown in FIG. 3.
Figure 7:
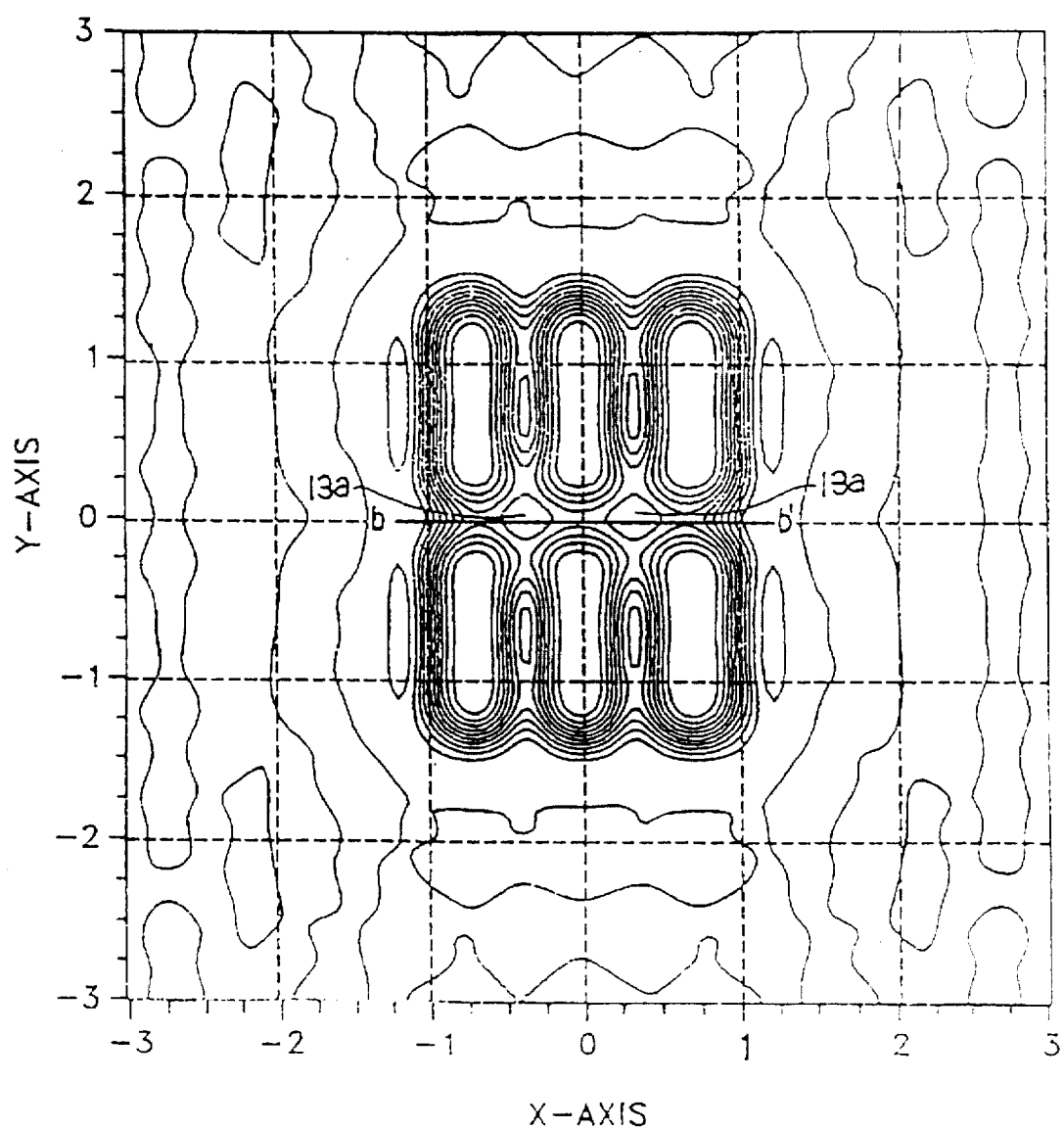
FIG. 7 is a plan view showing an aerial image created by a simulation, when a mask pattern is transferred onto a substrate using the photo mask shown in FIG. 6.

FIG. 7 shows an aerial image created by a simulation, when a mask pattern is transferred onto a substrate using the photo mask shown in FIG. 6. Referring to FIG. 7, the contour lines around reference character 13a are less dense than those in FIG. 4. Areas in which the contour lines are not densely formed correspond to an optical transmission area between opaque mask patterns 11 shown in FIG. 6. Especially, in an optical transmission area between opaque mask patterns 11 of FIG. 6, light is not gathered when a mask pattern is transferred, to thereby suppress a proximity effect.

Figure 5:
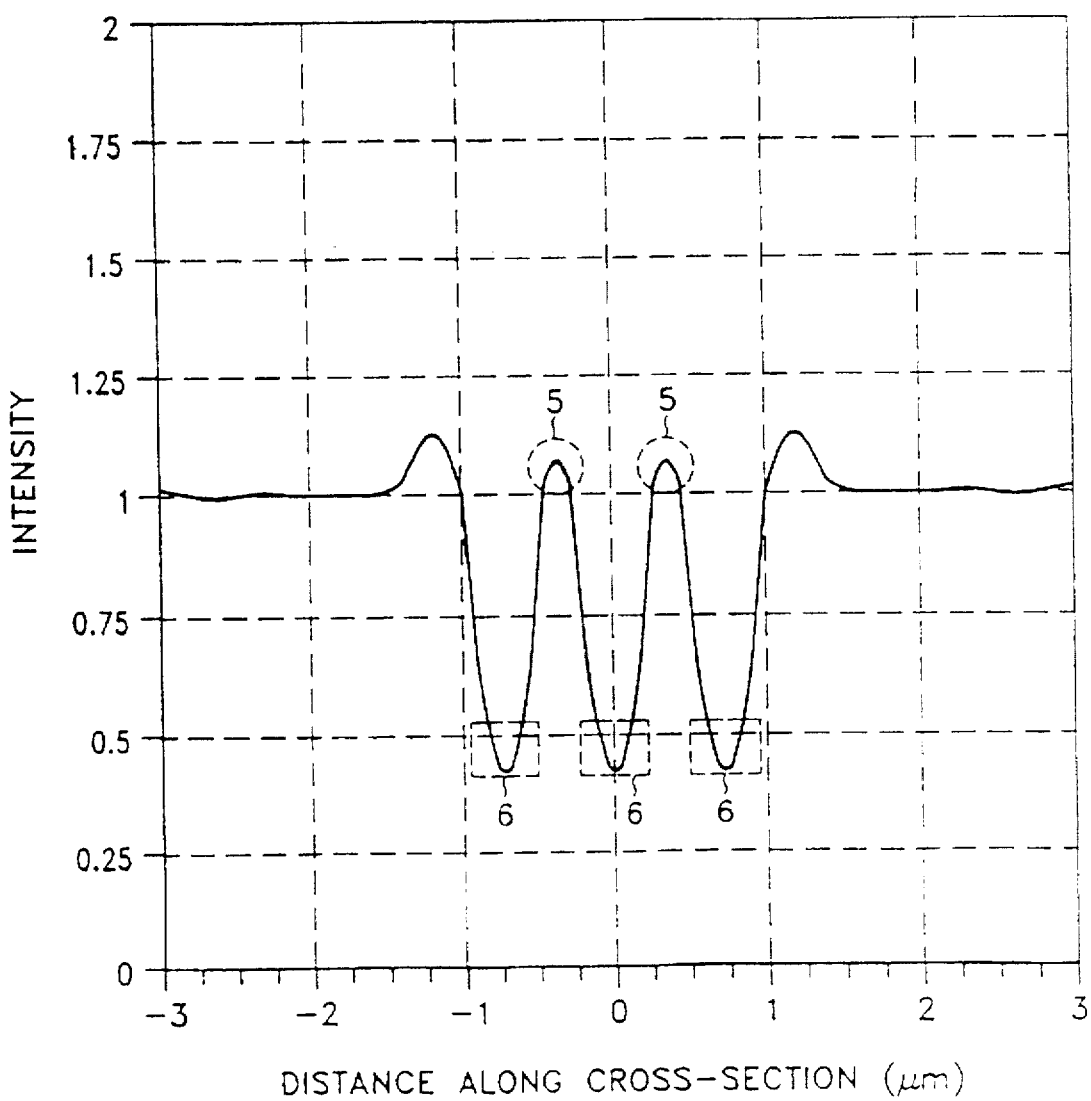
FIG. 5 is a graph representing the light intensity along line a—a' of FIG. 4.
Figure 8:
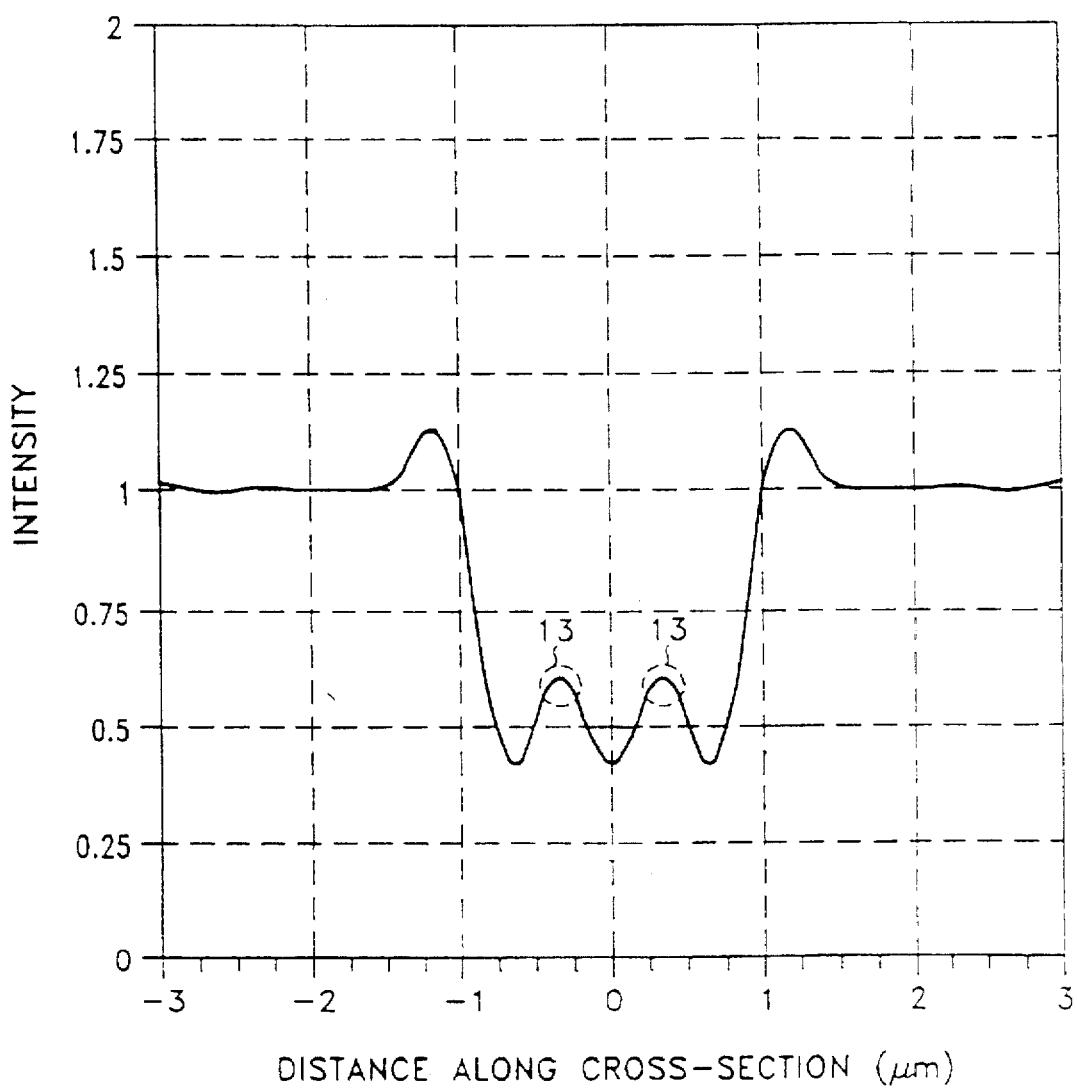
FIG. 8 is a graph representing the light intensity along line b—b' of FIG. 7.

FIG. 8 is a graph representing the light intensity along line b—b' of FIG. 7. Here, the light intensity along line b—b' is relatively uniform since a light intensity (reference numeral 13) is very low as compared with reference numeral 5 of FIG. 5. As a result, the proximity effect is suppressed when a photoresist pattern is formed using a photo mask according to the present invention.

Embodiment 2

FIG. 9 is a view of a photo mask according to the second embodiment of the present invention. Referring to FIG. 9, a rectangular opaque mask pattern 15 for defining an optical transmission area is periodically formed on a mask substrate (not shown). Also, an optical transmittance control film pattern 14 is formed in an intersection area of the optical transmission area between opaque mask patterns 15. In more detail, optical transmittance control film pattern 15 is formed in an area defined by edges of opaque mask pattern 14. Especially, when a mask pattern is transferred onto a substrate, optical transmittance control film pattern 15 maintains a uniform light intensity, to thereby suppress the proximity effect. Also, optical transmittance control film pattern 14 can be formed in a part of the intersection area of the optical transmission area between opaque mask patterns 15. Thus, the proximity effect can be suppressed by controlling the transmission rate of optical transmittance control film pattern 14.

In the second embodiment, the width and length of optical transmittance control film pattern 14 are 0.28 μm and 0.22 μm, respectively. The dimensions, width and length, of the opaque mask pattern 15 and the length between the opaque mask pattern 15 are the same as those of the first embodiment.

Figure 10:
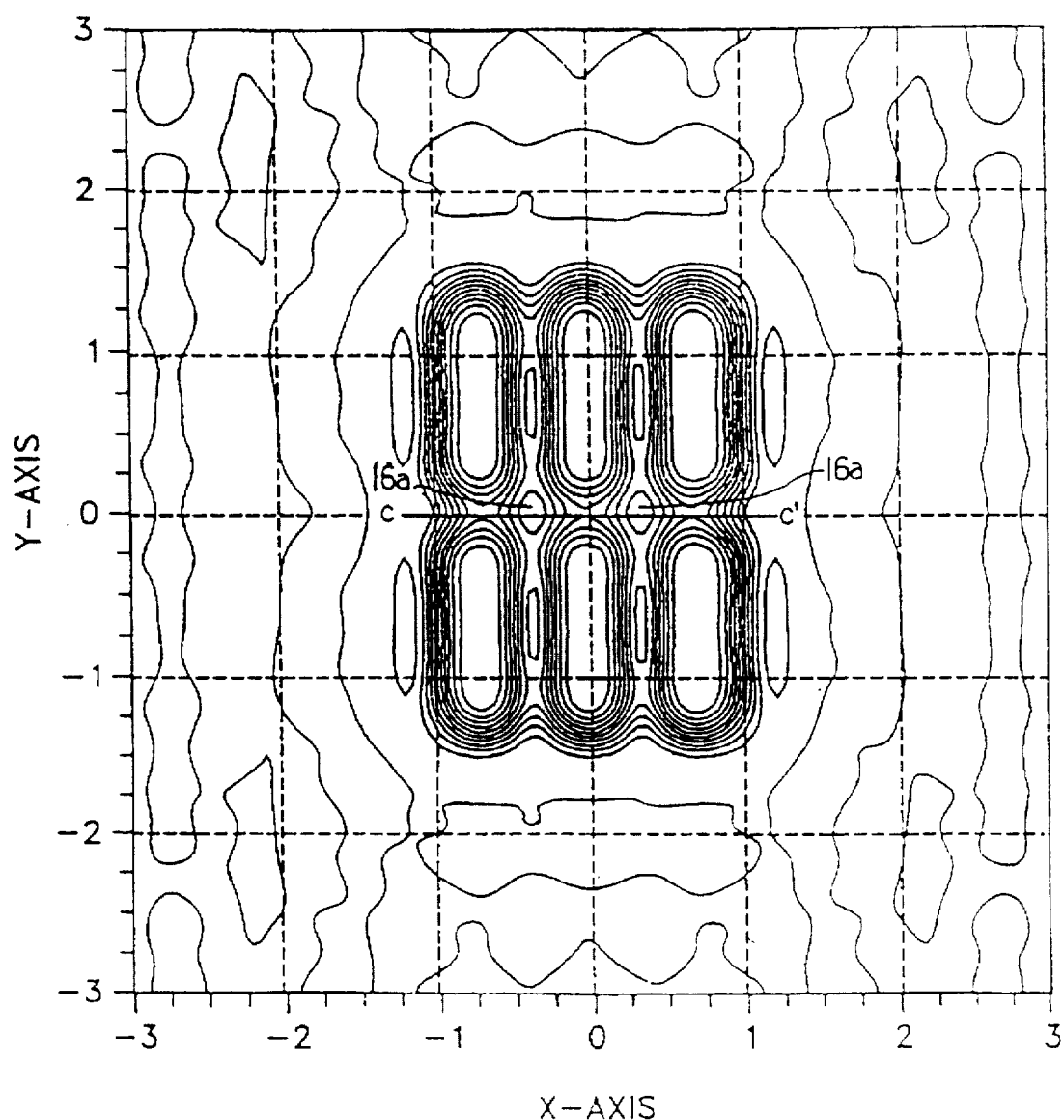
FIG. 10 is a plan view showing an aerial image created by a simulation, when a mask pattern is transferred onto a substrate using the photo mask shown in FIG. 9.

FIG. 10 is an aerial image created by a simulation, when a mask pattern is transferred onto a substrate using the photo mask shown in FIG. 9. Referring to FIG. 10, the contour lines around reference character 16a are less dense than those formed in FIG. 4. Those areas where the contour lines are not densely formed correspond to an optical transmission area between opaque mask patterns 15 as shown in FIG. 9. Especially, in an optical transmission area between opaque mask patterns 15, light is not gathered when a mask pattern is transferred, to thereby suppress the proximity effect.

Figure 11:
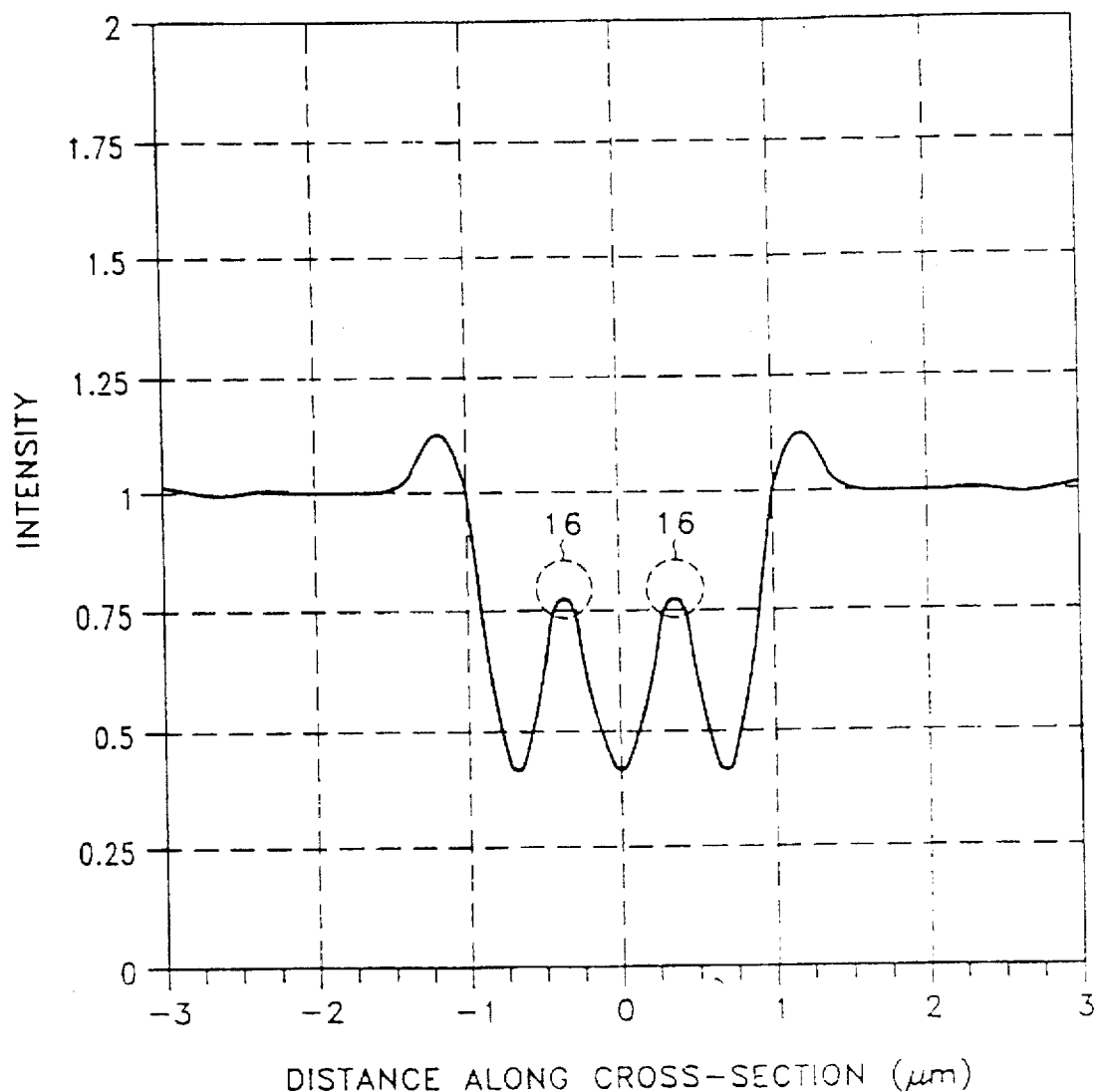
FIG. 11 is a graph representing the light intensity along line c—c' of FIG. 10.

FIG. 11 is a graph representing the light intensity along line c—c' of FIG. 10. Here, light intensity along line c—c' of FIG. 10 is relatively uniform since the light intensity at reference numeral 16 is much lower than that at reference numeral 5 of FIG. 5. As a result, the proximity effect is suppressed when a photoresist pattern is formed using a photo mask according to the present invention.

Embodiment 3

FIG. 12 is a view of a photo mask according to a third embodiment of the present invention. Referring to FIG. 12, a rectangular opaque mask pattern 20 for defining an optical transmission area is formed periodically on a mask substrate (not shown). Also, a first and second optical transmittance control film pattern 17 and 18 are formed in an intersection area of the optical transmission area between opaque mask pattern 20 and in the areas adjacent thereto. In more detail, first optical transmittance control film pattern 17 is formed parallel to the longer side of the rectangular opaque mask pattern 20, and second optical transmittance control film pattern 18 is formed perpendicular to the longer side of rectangular opaque mask pattern 20. Especially, when a mask pattern is transferred onto a substrate, first and second optical transmittance control film patterns 17 and 18 maintain a uniform light intensity, to thereby suppress the proximity effect.

In the third embodiment, the width and length of first optical transmittance control film pattern 17 are 0.28 μm and 0.42 μm, respectively. The width and length of second optical transmittance control film pattern 18 are 0.48 μm and 0.22 μm, respectively. The dimensions, width and length, of opaque mask pattern 20 and the length between opaque mask patterns 20 are the same as those of the first embodiment.

Figure 13:
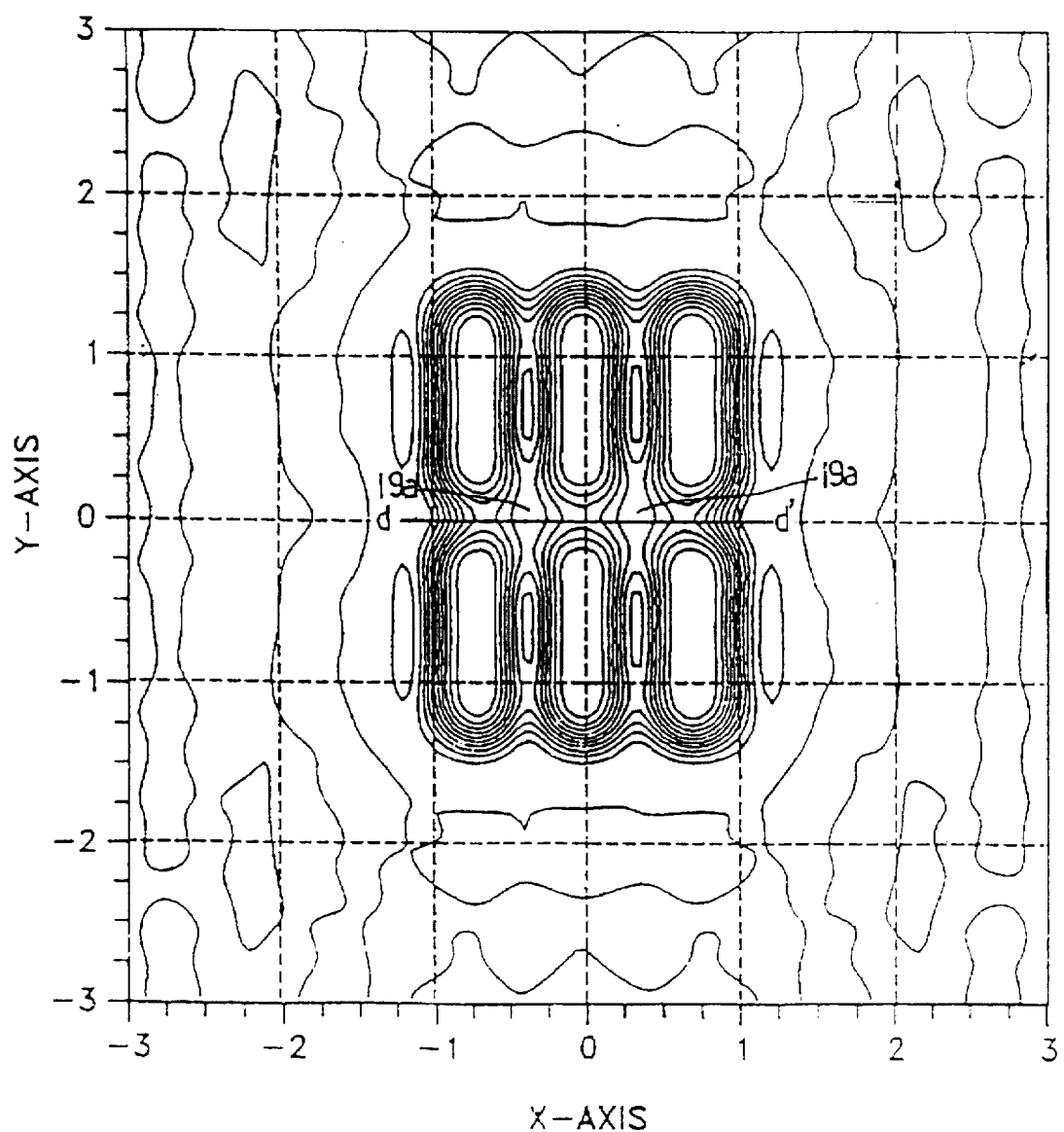
FIG. 13 is a plan view showing an aerial image created by a simulation, when a mask pattern is transferred onto a substrate using the photo mask shown in FIG. 12.

FIG. 13 is an aerial image created by a simulation, when a mask pattern is transferred onto a substrate using the photo mask shown in FIG. 12. Referring to FIG. 13, contour lines around reference character 19a are less dense than those formed in FIG. 4. Areas where the contour lines are not densely formed correspond to an optical transmission area between an opaque mask patterns 20 as shown in FIG. 12. Especially, in an optical transmission area between an opaque mask patterns 20, light is not gathered when a mask pattern is transferred, to thereby suppress the proximity effect.

Figure 14:
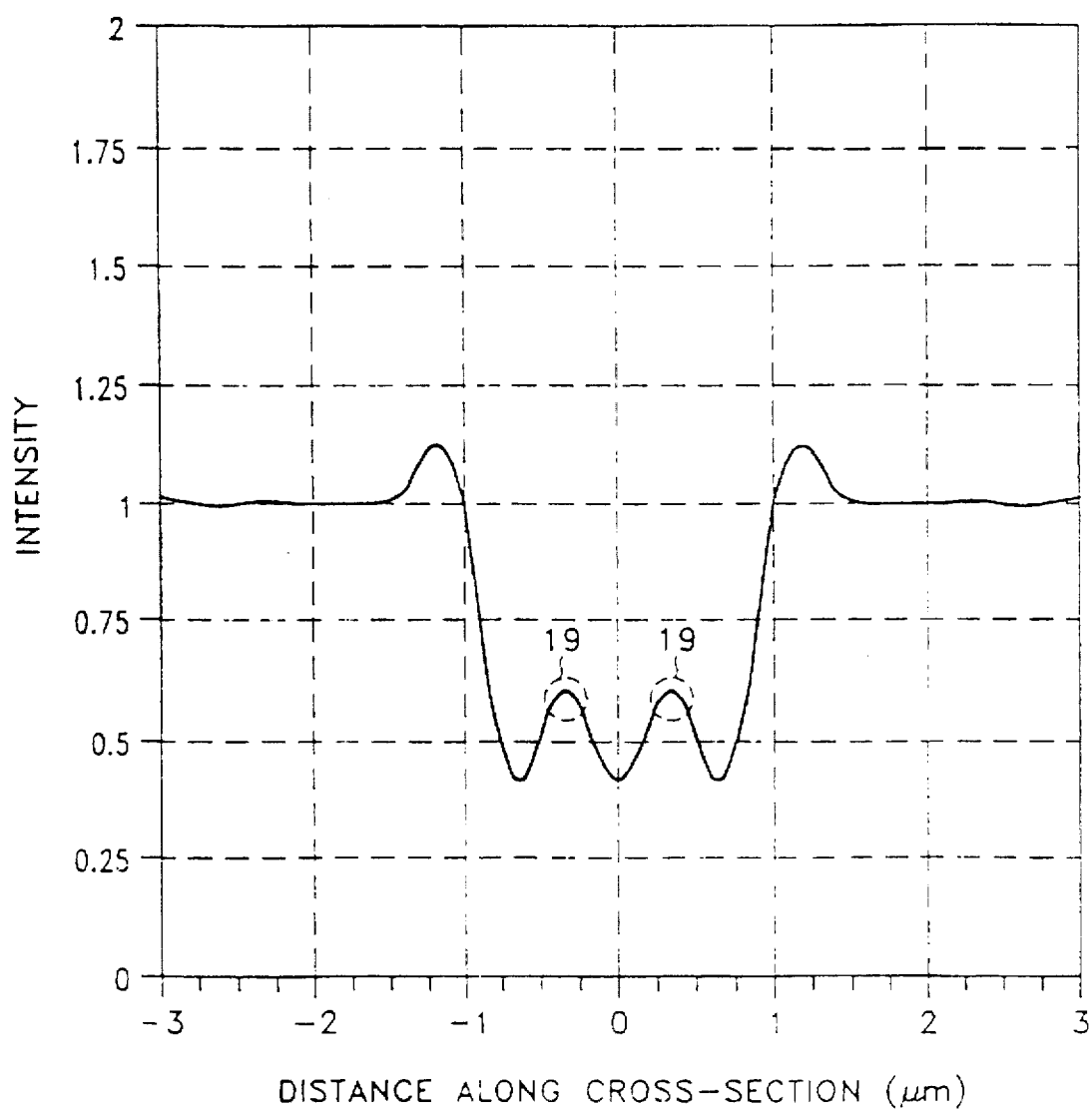
FIG. 14 is a graph representing the light intensity along line d—d' of FIG. 13.

FIG. 14 is a graph representing the light intensity along line d—d' of FIG. 13. Here, the light intensity along line d—d' of FIG. 13 is very uniform since the light intensity at reference numeral 19 is much lower than that at reference numeral 5 of FIG. 5. As a result, the proximity effect is suppressed when a photoresist pattern is formed using a photo mask according to the present invention.

Hereinafter, a method for manufacturing the photo mask illustrated by the first embodiment of the present invention will be explained by the following embodiments.

Embodiment 1

FIG. 15A to FIG. 15D are sectional views illustrating a method for manufacturing a photo mask according to the first embodiment of the present invention.

Figure 15A:
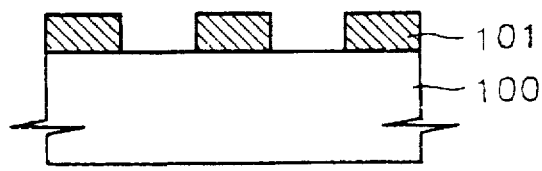
FIG. 15A to FIG. 15D are sectional views illustrating a method for manufacturing a photo mask according to the first embodiment of the present invention.

FIG. 15A shows a step of forming an opaque mask pattern 101 on a transparent substrate 100. In more detail, an opaque material layer is formed on a substrate 100, a light-blocking material is used as the opaque material layer. In the present embodiment, a chromium layer is used as the opaque material layer. Then, a photoresist layer (not shown) is formed on the opaque material layer and patterned to form a photoresist pattern (not shown) by exposing using an electron beam and developing process. Then, the opaque material is etched to form an opaque mask pattern 101 using the photoresist pattern as an etching mask. Thereafter, the photoresist pattern is removed.

Figure 15B:
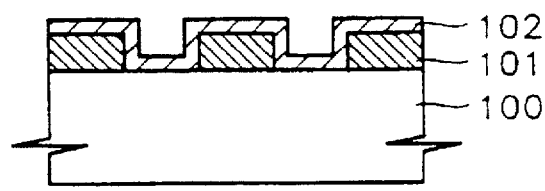

FIG. 15B shows a step of forming an optical transmittance control film 102 over the entire surface of the substrate 101. Referring to FIG. 15B, an optical transmittance control film 102 is formed on an opaque mask pattern 101 and a substrate 100. The optical transmittance control film 102 is formed of spin-on-glass (SOG), photoresist (PR), silicon oxide ($SiO_2$), aluminum (Al), silicon nitride ($Si_3N_4$), a polysilicon, titanium (Ti), titanium nitride (TiN), chromium (Cr) or tungsten (W).

Figure 15C:
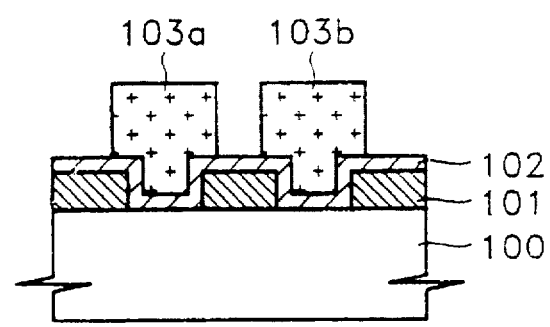

FIG. 15C shows a step of forming a photoresist pattern (103a, 103b) for patterning the optical transmittance control film 102. Referring to FIG. 15C, a photoresist layer is formed on the optical transmittance control film 102 and patterned to form a photoresist pattern (103a, 103b) by exposing using an electron beam and developing process. The photoresist pattern (103a, 103b) is formed between the individual portions of the opaque mask pattern 101.

Figure 15D:
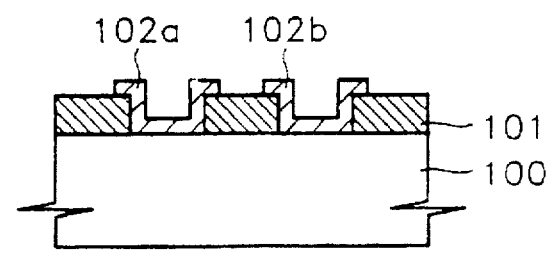

FIG. 15D shows a step of forming a transmittance control film pattern (102a, 102b) between the opaque mask patterns 101. Referring to FIG. 15D, the transmittance control film 102 is etched to form a transmittance control film pattern (102a, 102b) using the photoresist pattern (103a, 103b) as an etching mask. Thereafter, the photoresist pattern is removed and a manufacturing process of a photo mask according to the present invention is completed.

Embodiment 2

FIG. 16A to FIG. 16D are sectional views illustrating a method for manufacturing a photo mask according to the second embodiment of the present invention.

Figure 16A:
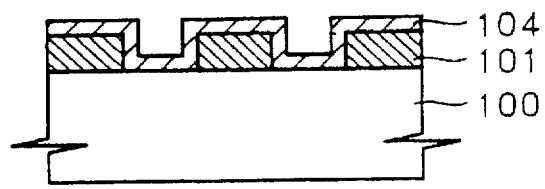
FIG. 16A to FIG. 16D are sectional views illustrating a method for manufacturing a photo mask according to the second embodiment of the present invention.

FIG. 16A shows a step of forming an opaque mask pattern 101 and etch stopping film 104 on a transparent substrate 100. In more detail, an etch stopping film is formed on an opaque mask pattern 101 and a substrate 100, the etching stopping film is used as an etch stop when etching an optical transmittance control film by subsequent process. The etch stopping film 104 is spin-on-glass, silicon oxide or silicon nitride when the optical transmittance control film is a metal, e.g., aluminum or chromium. The formation of an opaque mask pattern 101 is the same as that of the first embodiment.

Figure 16B:
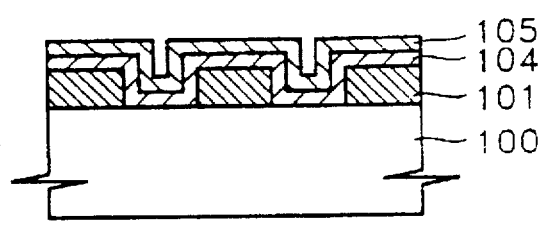

FIG. 16B is a step of forming an optical transmittance control film 105 on the etch stopping film 104. Referring to FIG. 16B, an optical transmittance control film 105 is formed on the etch stopping film 104. The optical transmittance control film 105 is formed of spin-on-glass (SOG), photoresist (PR), silicon oxide ($SiO_2$), aluminum (Al), silicon nitride ($Si_3N_4$), a polysilicon, titanium (Ti), titanium nitride (TiN), chromium (Cr) or tungsten (W).

Figure 16C:
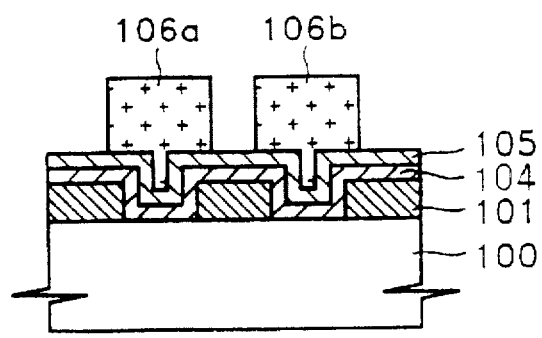

FIG. 16C shows a step of forming a photoresist pattern (106a, 106b) for patterning the optical transmittance control film 105 104. Referring to FIG. 16C, a photoresist layer is formed on the optical transmittance control film 105 and patterned the photoresist layer to form a photoresist pattern (106a, 106b) by exposing using an electron beam and developing process. The photoresist pattern (106a, 106b) is only formed between the opaque mask pattern 101.

Figure 16D:
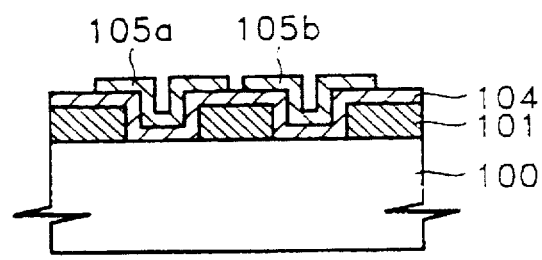

FIG. 16D shows a step of forming a transmittance control film pattern (105a, 105b) between the opaque mask pattern 101. Referring to FIG. 16D, the transmittance control film 105 is etched to form a transmittance control film pattern (105a, 105b) using the photoresist pattern (106a, 106b) as an etching mask. Thereafter, the photoresist pattern is removed and the manufacturing process of a photo mask according to the present invention is completed.

Embodiment 3

Figure 17A:
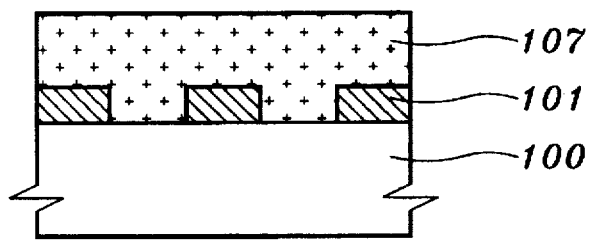
FIG. 17A to FIG. 17D are sectional views illustrating a method for manufacturing a photo mask according to the third embodiment of the present invention.

FIG. 17A to FIG. 17D are sectional views illustrating a method for manufacturing a photo mask according to the third embodiment of the present invention. FIG. 17A shows a step of forming an photoresist layer 107 on an opaque mask pattern 101 and transparent substrate 100. In more detail, an photoresist layer is formed on an opaque mask pattern 101 and a substrate 100. The formation of an opaque mask pattern 101 is the same as those of the first and second embodiments.

Figure 17B:
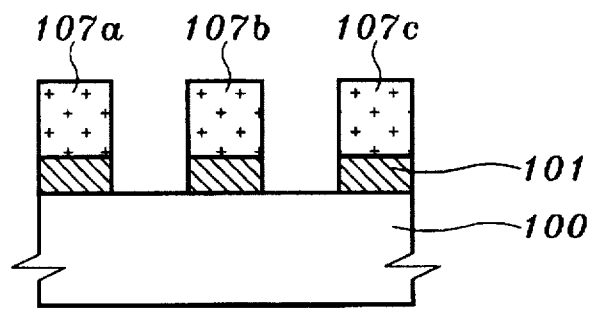

FIG. 17B shows a step of forming a photoresist pattern (107a, 107b, 107c). Referring to FIG. 17B, a photoresist layer is patterned to form a photoresist pattern (107a, 107b, 107c) by exposing using an electron beam and developing process. The photoresist pattern (106a, 106b) is only formed on the opaque mask pattern 101.

Figure 17C:
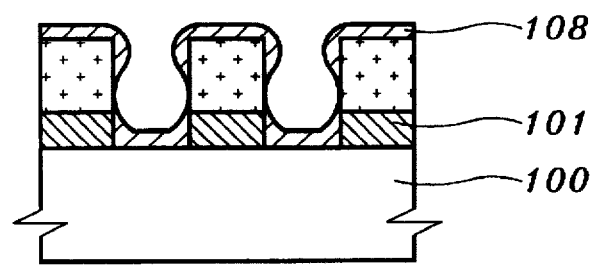

FIG. 17C shows a step of forming an optical transmittance control film 108 over the resultant material. Referring to FIG. 15C, an optical transmittance control film 108 is formed over the entire surface of the resultant material. The material used as the optical transmittance control film 108 is the same as those of the first and second embodiments.

Figure 17D:
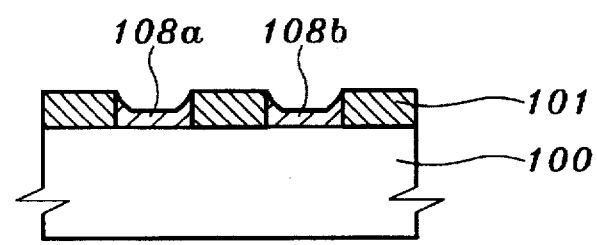

FIG. 17D shows a step of forming a transmittance control film pattern (108a, 108b) between the opaque mask pattern 101. Referring to FIG. 17D, the transmittance control film 108 is etched to form a transmittance control film pattern (108a, 108b) using a lift-off process. If so, the manufacturing process of a photo mask according to the present invention is completed.

According to the photo mask of the present invention, since a proximity effect is suppressed by forming an optical transmittance control film pattern in an intersection area of the transmission area between the opaque mask pattern and in the areas adjacent thereto, the shape of a mask pattern is exactly transferred onto a substrate, to thereby increase a capacitor area and reliability of a semiconductor device.

In addition, when a mask pattern is exactly transferred onto a substrate, an effective use of the substrate and fine pattern formation according to the high integration of a semiconductor device are possible.

The foregoing embodiments have been given by way of example to teach the making and use of the present invention. The present invention is not limited to the exemplary embodiments discussed above. It is to be understood that changes and variations may be made to preferred embodiments described above without departing from the spirit or scope of the following claims.

What is claimed is:

1. A clear-field photo mask for transferring a mask pattern onto a semiconductor wafer in a photolithographic procedure using a positive photoresist, comprising:

a transparent substrate;

an opaque mask element formed on the substrate, wherein the opaque mask element blocks light to define an optical transmission area adjoining edges of the opaque mask element that intersect to form a corner; and an optical transmittance control pattern formed in a portion of the optical transmission area near said corner of said opaque mask element, for reducing rounding of the shadow of said corner during said photolithographic procedure.

2. The photo mask according to claim 1, wherein the optical transmittance control film pattern is formed from material selected from the group consisting of: spin-on-glass (SOG), photoresist (PR), silicon oxide (SiO$_2$), aluminum (Al), silicon nitride (Si$_3$N$_4$), a polysilicon, titanium (Ti), titanium nitride (TiN), chromium (Cr) and tungsten (W).

3. A clear-field photo mask for transferring a mask pattern onto a semiconductor wafer in a photolithographic procedure using a positive photo-resist, comprising:

a transparent substrate;

a rectangular opaque mask element formed on the substrate, wherein the rectangular opaque mask element selectively blocks light to define an optical transmission area surrounding the edges of the rectangular opaque mask element, which edges meet at corners of said rectangular opaque mask element; and, an optical transmittance control pattern formed in portions of the optical transmission area near the corners of the rectangular opaque mask element, for reducing rounding of corners of the shadow of said rectangular opaque mask element during said photolithographic procedure.

4. A clear-field photo mask for transferring a mask pattern onto a semiconductor wafer in a photolithographic procedure using a positive photo-resist, comprising:

a transparent substrate;

an opaque mask pattern formed on the substrate, wherein the opaque mask pattern includes an array of rectangular shaped masking portions arranged in rows and columns for selectively blocking light, such that rectangular shaped masking portions adjacent to each other in each row are separated by a respective columnar optical transmission area, and such that rectangular shaped masking portions adjacent to each other in each column are separated by a respective row-wise optical transmission area; and an optical transmittance control pattern for suppressing rounding of the corners of shadows of said rectangular shaped masking portions during said photolithography, respective portions of the optical transmittance control pattern being formed at the intersections of respective columnar and row-wise optical transmission areas.

5. The photo mask according to claim 4, wherein the optical transmittance control pattern is formed beyond the intersections of respective columnar and row-wise optical transmission areas to extend along at least one of the columnar and row-wise optical transmission areas proximate at least one of the rectangular shaped masking portions.

6. The photo mask according to claim 4, wherein the optical transmittance control pattern is formed beyond the intersections of respective columnar and row-wise optical transmission areas to extend along the columnar and row-wise optical transmission areas proximate the rectangular shaped masking portions.

7. A clear-field photo mask for transferring a mask pattern onto a semiconductor wafer in a photolithographic procedure using a positive photo-resist, comprising:

a transparent substrate;

an opaque mask pattern formed on the substrate, wherein the opaque mask pattern includes an array of rectangular shaped masking portions arranged in rows and columns for selectively blocking light, such that rectangular shaped masking portions adjacent to each other in each row are separated by a respective columnar optical transmission area, and such that rectangular shaped masking portions adjacent to each other in each column are separated by a respective row-wise optical transmission area; and means for suppressing rounding of the corners of shadows of said rectangular shaped masking portions at each intersection of one said respective columnar optical transmission area and one said row-wise optical transmission area during said photolithography, which means includes:

a first optical transmittance control pattern having a respective portion covering each intersection of one said respective columnar optical transmission area and one said row-wise optical transmission area and covering portions of that one said respective columnar optical transmission area extending from each side of that said intersection, and a second optical transmittance control pattern having a respective portion covering each intersection of one said respective columnar optical transmission area and one said row-wise optical transmission area and covering portions of that one said respective row-wise optical transmission area extending from each side of that said intersection.

8. A method of manufacturing a photo mask, comprising the steps of:

selectively forming an opaque mask pattern which defines an optical transmission area on a substrate;

forming an optical transmittance control film over the opaque mask pattern and substrate; and patterning the optical transmittance control film such that portions of the optical transmittance control film are disposed in the optical transmission area between edges of the opaque mask pattern.

9. The method of manufacturing a photo mask according to claim 8, wherein the step of patterning the optical transmittance control film further comprising the steps of:

forming a photoresist pattern over selected portions of the optical transmittance control film, said selected portions corresponding to the optical transmission area defined by the edges of the opaque mask pattern;

etching away portions of the optical transmittance control film not covered by the photoresist pattern; and, removing the photoresist pattern.

10. The method of manufacturing a photo mask according to claim 8, wherein the opaque mask pattern is formed of chromium and the optical transmittance control film pattern is formed from material selected from the group consisting of: spin-on-glass (SOG), photoresist (PR), silicon oxide ($SiO_2$), aluminum (Al), silicon nitride ($Si_3N_4$), a polysilicon, titanium (Ti), titanium nitride (TiN), chromium (Cr) and tungsten (W).

11. A method of manufacturing a photo mask, comprising the steps of:

forming an opaque mask pattern which defines an optical transmission area on a substrate;

forming an etch-stopping film on the opaque mask pattern and the substrate;

forming an optical transmittance control film on the etch—stopping film; and patterning the optical transmittance control film such that portions of the optical transmittance control film are disposed in the optical transmission area between edges of the opaque mask pattern.

12. The method for manufacturing a photo mask according to claim 11, wherein the etch-stopping film is formed from a material selected from the group consisting of: spin-on-glass (SOG), silicon oxide ($SiO_2$) and silicon nitride ($Si_3N_4$).

13. The method for manufacturing a photo mask according to claim 11, wherein the optical transmittance control film pattern is formed from a material selected from the group consisting of: aluminum (Al), a polysilicon, titanium (Ti), titanium nitride (TiN), chromium (Cr) and tungsten (W).

14. The method of manufacturing a photo mask according to claim 11, wherein the step of patterning the optical transmittance control film further comprises the steps of:

forming a photoresist pattern over selected portions of the optical transmittance control film, said selected portions corresponding to the optical transmission area defined by the edges of the opaque mask pattern;

etching away portions of the optical transmittance control film not covered by the photoresist pattern; and, removing the photoresist pattern.

15. A method for manufacturing a photo mask, comprising the steps of:

forming an opaque mask pattern defining an optical transmission area on a substrate;

forming a photoresist film over the opaque mask pattern and substrate;

exposing the optical transmission area on the substrate by patterning the photoresist film;

forming an optical transmittance control film over the entire surface of the resultant structure; and forming an optical transmittance control film pattern over the optical transmission area between edges of the opaque mask pattern by etching away the patterned photoresist film using a lift-off process.

16. A method for manufacturing a semiconductor device, comprising the steps of:

forming an array of opaque mask patterns on a substrate which define a grid-shaped optical transmission area between adjacent opaque mask pattern; and, forming an optical transmittance control fill over a portion of the grid-shaped optical transmission area.

17. The method according to claim 16, wherein respective opaque mask patterns are rectangularly shaped and the resulting grid-shaped optical transmission area comprises columns and rows separating adjacent opaque mask patterns, and wherein the optical transmittance control film is formed over a portion of the grid-shaped optical transmission area defined by the respective intersections of the columns and rows.

18. The method according to claim 17, wherein the optical transmittance control film is formed beyond the intersections of the columns and rows to extend along at least one of the column and row optical transmission areas.

19. The method according to claim 17, wherein the optical transmittance control film is formed beyond the intersections of columns and rows to extend along both the column and row optical transmission areas.

* * * * *